(12) United States Patent
Carlson (10) Patent No.: US 7,082,591 B2
(45) Date of Patent: Jul. 25, 2006

(54) METHOD FOR EFFECTIVELY EMBEDDING VARIOUS INTEGRATED CIRCUITS WITHIN FIELD PROGRAMMABLE GATE ARRAYS

(75) Inventor: Randolph S. Carlson, Carson City, NV (US)

(73) Assignee: Irvine Sensors Corporation, Costa Mesa, CA (US)

( * ) Notice: Subject to any disclaimer, the term of this patent is extended or adjusted under 35 U.S.C. 154(b) by 525 days.

(21) Appl. No.: 10/346,363

(22) Filed: Jan. 17, 2003

(65) Prior Publication Data
US 2004/0040005 A1    Feb. 26, 2004

Related U.S. Application Data

(60) Provisional application No. 60/348,852, filed on Jan. 17, 2002.

(51) Int. Cl.
*G06F 17/50* (2006.01)
*G01R 31/28* (2006.01)

(52) U.S. Cl. .............. 716/16; 716/18; 714/733
(58) Field of Classification Search ................ 716/16, 716/18; 714/733
See application file for complete search history.

(56) References Cited

U.S. PATENT DOCUMENTS 6,044,481 A * 3/2000 Kornachuk et al. ........ 714/724
6,049,222 A * 4/2000 Lawman .................... 326/38
6,421,813 B1 * 7/2002 Jeddeloh .................... 716/5
6,627,985 B1 * 9/2003 Huppenthal et al. ........ 257/686

OTHER PUBLICATIONS

Ouaiss, I, et al., "Hierarchical memory mapping during synthesis in FPGA-based reconfigurable computers", IEEE, Mar. 2001, pp. 650-657.*

* cited by examiner

*Primary Examiner*—Stacy A. Whitmore
(74) *Attorney, Agent, or Firm*—McDermott Will & Emery LLP (57) ABSTRACT

A chip stack includes a field programmable gate array (FPGA) and an auxiliary component coupled to the FPGA with intercommunicated clock, control and/or data signals. The auxiliary component has a functionality mapped into the FPGA. The pin definition of the FPGA is redefined so that the FPGA and the auxiliary component in combination operate as a modified FPGA. A test circuit is programmed into the FPGA to exercise the auxiliary component to test functionality and timing performance at full speed. The functionality of the auxiliary component mapped into the FPGA is parameterized, such as for the data word width for reading and/or writing data words of different lengths into the auxiliary component in both an aligned and nonaligned manner. A memory interface allows multiple auxiliary circuits to be accessed through the FPGA either together to generate a wider data word or serially to achieve a greater memory depth.

35 Claims, 6 Drawing Sheets

METHOD FOR EFFECTIVELY EMBEDDING VARIOUS INTEGRATED CIRCUITS WITHIN FIELD PROGRAMMABLE GATE ARRAYS

RELATED APPLICATIONS

This application is related to U.S. Provisional Patent Application Ser. No. 60/348,852, filed on Jan. 17, 2002, which is incorporated herein by reference and to which priority is claimed pursuant to 35 USC 119.

BACKGROUND OF THE INVENTION

1. Field of the Invention

The invention relates to methods of using field programmable gate arrays (FPGA) and in particular to a method of including the operation of more than one integrated circuit within the array.

2. Description of the Prior Art

Of the many varieties of integrated circuits available on the market today, field programmable gate arrays (FPGAs) are particularly useful when building many kinds of electronic devices and systems. Because FPGAs allow the designer to integrate complex logic that is peculiar to his application in one or perhaps a few integrated circuits without suffering the cost, delay and risk that typically are incurred when designing a custom integrated circuit, use of FPGAs greatly reduce both design cost and time-to-market for new products.

Not withstanding the great utility of FPGAs, there exist several limitations to the usefulness of these devices. FPGAs consist of logic circuits and interconnects that are configured by yet additional configuration logic circuits distributed within the array. The result is that FPGA chips are large compared with custom designed logic chips of functionality similar to the FPGA logic implementation. The large size of FPGAs compared to custom logic chips increases their cost and power dissipation and reduces their operating speed owing to the greater on-chip wiring distances and resulting greater wiring capacitance.

A further limitation of FPGAs is their requirement for complex, expensive integrated circuit processes for reasonable implementation of moderate to large capacity FPGAs. In this context, complex integrated circuit processes are typically those offering many levels or layers of interconnection wiring on the chip. Such processes are necessary to efficient implementation of FPGAs due to the need to distribute configuration logic throughout the array, and because FPGAs are fundamentally used to implement random logic designs with the attendant topological complexity. In contrast to FPGAs, certain highly regular, single purpose integrated circuits achieve very much higher densities and performance from simpler, lower cost processes. An example of such circuits would be memory circuits, for instance. Memory circuits are typically built with processes having three or fewer layers of interconnect where as FPGAs frequently are built on processes using six or more layers of interconnect. The result is that while memory functions can be provided within a user's logic design when implemented on many FPGAs, this memory is quite costly compared to similar amounts of memory in the form of standard memory chips. Further, there is a rather small, upper limit to the. amount of memory that can be implemented on a single FPGA. For instance, The Xilinx Vertex II family of FPGAs offers up to 5.5 million bits of RAM whereas a Samsung MT6VI6M18F2-3M DRAM provides 288 million bits.

A particularly useful aspect of FPGAs is the ability of a logic designer using FPGAs to perform much of his design activity, including functional verification and timing validation, on FPGA design software. Use of the FPGA design software gives a great advantage compared to designing logic systems using many separate parts because the interconnect between parts of the FPGA is fully characterized within the design system and can therefore be validated. In contrast, the designer using multiple devices and designing a circuit board, for instance, to interconnect these parts cannot be sure of the propagation characteristics (time delay, waveform reflections and distortions, etc.) introduced by the circuit board. This, in turn introduces uncertainty in to the design process, and frequently requires design modifications, after the first unit(s) have been made, to correct the signal transmission effects introduced by the interconnecting circuit board.

An interesting aspect of FPGA technology is that the number of logic gates that may be implemented by a user on a single FPGA chip has increased dramatically over time. In 2001, gate arrays with a few million gates capacity were available commercially (e.g. Xilinx Vertex II, etc.). It is forecast that by 2004, FPGA parts capable of implementing up to 50 million gates of user specified logic will be commercially available. This has resulted in the very significant limitation that sufficient design talent and resources to generate new logic designs that can utilize these very large FPGAs is not easily available. Particularly, it has been noted that newly implemented FPGA designs tend to include ever increasing proportions of logic imported or copied from previous designs.

Specialized and more highly productive logic design tools are also being introduced that speed the design and design verification for new logic designs. Examples of these new design tools are the Handel-C and Pebble hardware design languages that convert relatively high level descriptions of an FPGA user's desired logic functionality into a detailed design. Particularly, useful is the Handel-C compiler approach which allows the user to define the desired functionality of his very high speed integrated circuit (VHSIC) in the form of an algorithm in C programming language. The Handel-C compiler then generates a VHSIC hardware description language (VHDL) description of a logic circuit that implements the functionality of the described algorithm. The FPGA design process then proceeds with the steps of 1) synthesis: conversion of the VHDL logic description into a specific logic topology implementable in FPGA gates; 2) place and route: assignment of FPGA gales to specific locations within the FPGA chip and assignment of specific interconnection paths within the FPGA to connect the logic signals; and 3) programming of the FPGA so that it will perform the user's desired functionality. These latter steps (1–3) are provided, typically, as part of existing FPGA design tools, with the Handel-C compiler being an "adjunct" functionality. Further, it is often desirable to review the arrangement and functional speed of the design as implemented in the FPGA by this design process. Simulation software is typically used for this process that relies on known processing delay for individual FPGA logic elements, and for various configurations of FPGA internal interconnects.

In particular this Handel-C compiler approach to logic design allows algorithms that currently operate on conventional computers to be used as the basis of logic designs with the advantage of capturing what is often proven and tested functionality for complex tasks. An example of such an algorithm-to-logic transformation would be the implementation of a transfer control protocol/internet protocol (TCP/IP) processing "stack" implemented in logic, but derived from a C program with this function.

Notwithstanding the very considerable efficiency of time and assurance of correct functionality that is afforded by the Handel-C and similar design methodologies, there is a significant limitation in the current art with respect to the unconstrained use of C programs as the basis for logic design. Particularly, it is generally difficult to implement complex data structures, pointer references and object oriented programs in gate arrays using the Handel-C programming technique. This limitation with respect to data structures and software objects is in part due to the rather limited amounts of memory elements available within FPGAs and also due to limitations of the programming languages currently available. Since very many interesting and useful functionalities have been implemented in programs that utilize complex data structures and/or employ object oriented programming techniques, which is not directly implementable using the current Handel-C design technique, FPGA implementation of these algorithms becomes very problematic and requires very great expenditure of design and design verification effort in many cases.

It is the object of the invention to allow the direct application of FPGAs to a wider set of user defined applications by better supporting large amounts of memory.

Another object of the invention is to provide FPGAs with more extensive memory, dedicated processor and similar functionality than is practical to do by embedding such functionality within the FPGA chip.

A yet further object of the invention is to realize electronic modules containing one or more FPGAs together with supporting circuits such as memory, processors, communications interface circuits and the like; that are fully characterized with respect to functionality and performance to an extent allowing the entire module to be treated as an FPGA component for purposes of generating, documenting and validating a user design with standard FPGA design tools.

BRIEF SUMMARY OF THE INVENTION

The illustrated embodiment of the invention is an improvement in an apparatus comprising a plurality of pre-formed IC chips encapsulated in stackable layers in an electronic package, including at least one field programmable gate array (FPGA). The improvement comprises a field programmable gate array (FPGA), and at least one auxiliary logic component coupled to the FPGA with at least one intercommunicated clock, control and/or data signal between the FPGA and the auxiliary logic component.

In one embodiment the auxiliary logic component or a plurality of auxiliary logic components and the FPGA or a plurality of FPGAs are interconnected through discrete interconnections with each other. In another embodiment the auxiliary logic component or a plurality of auxiliary logic components and the FPGA or a plurality of FPGAs are interconnected through commonly shared connections.

The auxiliary component has a functionality and in one embodiment the functionality of the auxiliary component is mapped into the FPGA. The FPGA has a pin definition and the mapping of the functionality into the FPGA redefines the FPGA pin definition. The FPGA with redefined FPGA pin definition and the auxiliary logic component function in combination as a modified FPGA.

In still a further embodiment a test circuit is programmed into the FPGA to exercise the auxiliary logic component. In the illustrated embodiment the auxiliary logic component is a memory circuit.

In still a further embodiment a test circuit is programmed into the FPGA to exercise the memory circuit or a plurality of memory circuits as auxiliary logic components. The test circuit exercises each of the memory circuits to test functionality and timing performance, preferably at full speed of operation of the auxiliary logic component.

In yet another embodiment the functionality of the auxiliary logic component mapped into the FPGA is parameterized. The parameterized functionality of the auxiliary logic component mapped into the FPGA comprises an arbitrary data word width. The parameterized functionality of the auxiliary component mapped into the FPGA comprises reading and/or writing data words of different lengths into the auxiliary component in both an aligned and a nonaligned manner. In one embodiment the parameterized functionality of the auxiliary logic component mapped into the FPGA comprises a memory interface that allows multiple auxiliary logic circuits to be accessed through the FPGA either together to generate a wider data word or serially to achieve a greater memory depth.

It is also to be expressly understood that the invention includes within its scope a method or improvements in a method comprised of the steps for performing the functions of the above described circuits.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

A plurality of pre-formed IC chips encapsulated in stackable layers in an electronic package includes a field programmable gate array (FPGA) and an auxiliary logic component coupled to the FPGA with at least one intercommunicated clock, control and/or data signal between the FPGA and the auxiliary logic component. The auxiliary component has a functionality mapped into the FPGA. The FPGA has a pin definition which in one embodiment is redefined so that the FPGA and the auxiliary logic component function in combination as a modified FPGA. A test circuit is programmed into the FPGA to exercise the auxiliary logic component to test functionality and timing performance, preferably at full speed. The functionality of the auxiliary logic component mapped into the FPGA is parameterized, such as an arbitrary data word width for reading and/or writing data words of different lengths into the auxiliary component in both an aligned and a nonaligned manner. A memory interface allows multiple auxiliary logic circuits to be accessed through the FPGA either together to generate a wider data word or serially to achieve a greater memory depth.

Figure 1:
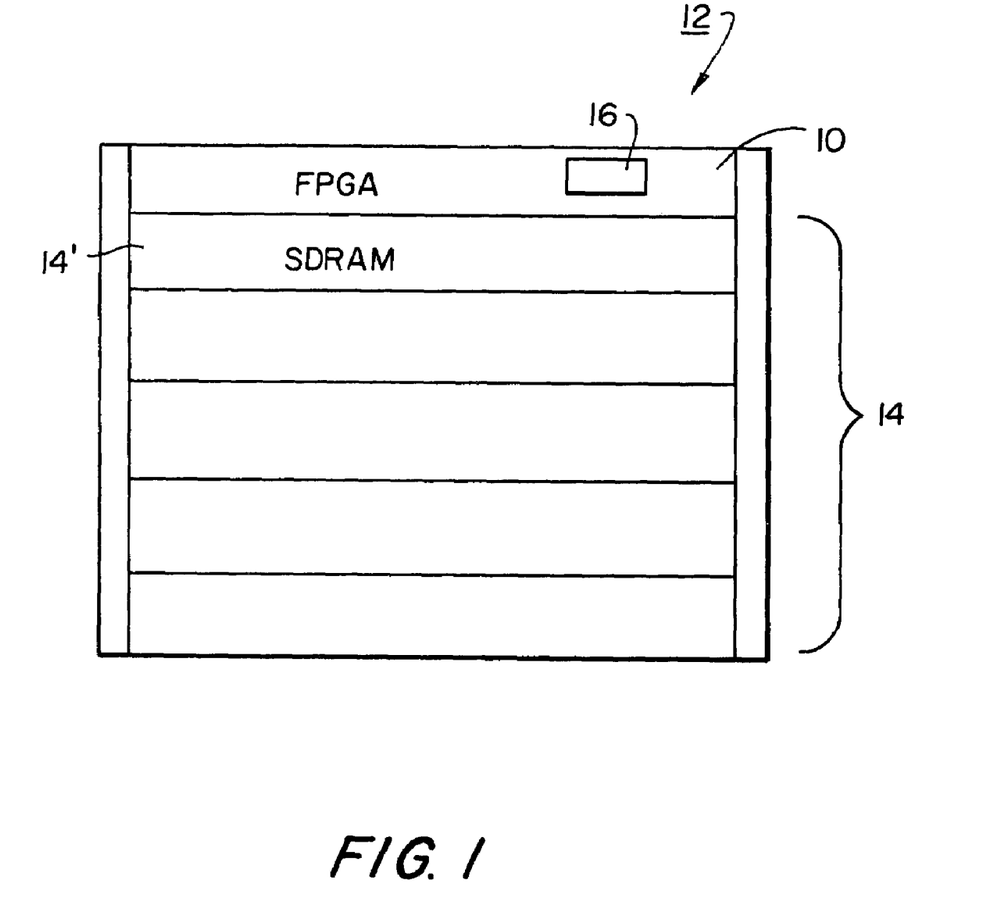
FIG. 1 is a diagrammatic block diagram illustrating a chip stack with the FPGA improvements of the invention

In a first preferred embodiment of the invention as diagrammatically shown in FIG. 1, one or more FPGAs 10 is combined in a electronic module 12 using using a stacked architecture such as that developed by Irvine Sensors and generally described in Irvine Sensors issued patents, hereby incorporated by reference, , with one or more auxiliary logic components 14, such as synchronous dynamic random access memory SDRAM chips 14'. The auxiliary logic components 14 being interconnected to I/O pins of the FPGAs 10 so that the auxiliary logic components 14 may exchange clock, control and/or data signals with the FPGA(s) 10. Those familiar with the art will appreciate that the interconnection between FPGA(s) 10 and auxiliary logic components 14 may be such that the auxiliary components 14 are individually or discretely connected with each other, each to unique pins of an FPGA 10; or that a plurality of auxiliary logic components 14 may be connected by shared connections to the FPGA 10 (e.g. through a data bus); or that a plurality of FPGAs can similarly be connected to one or more auxiliary logic components 14 with shared wiring. While a range of interconnect configurations is possible, it is particularly preferred in many cases that there exist no sharing of interconnect control or data signals between the FPGA 10 and each of a plurality of auxiliary logic components 14.

A further aspect of the first embodiment of the invention is a set of one or more module specific FPGA design files that define a portion of the FPGA's logic in such a way that the functionality of some of the auxiliary logic components 14 are mapped into the FPGA 10. These module specific FPGA design files, it will be appreciated, may take the form of module internally programmed cores (MIPCs) 16. It will be further appreciated that a convenient function of these MIPCs 16 may include the redefinition of FPGA signals that are brought out to the MCM external pins; and that by use of the above described type of MIPC 16, together with files defining the functionality, pinout and internal arrangement of the initial FPGA 10, it becomes possible for the user or logic designer to treat the entire MCM containing both FPGA 10 and auxiliary logic components 14 as a variant of the basic FPGA.

Figure 2:
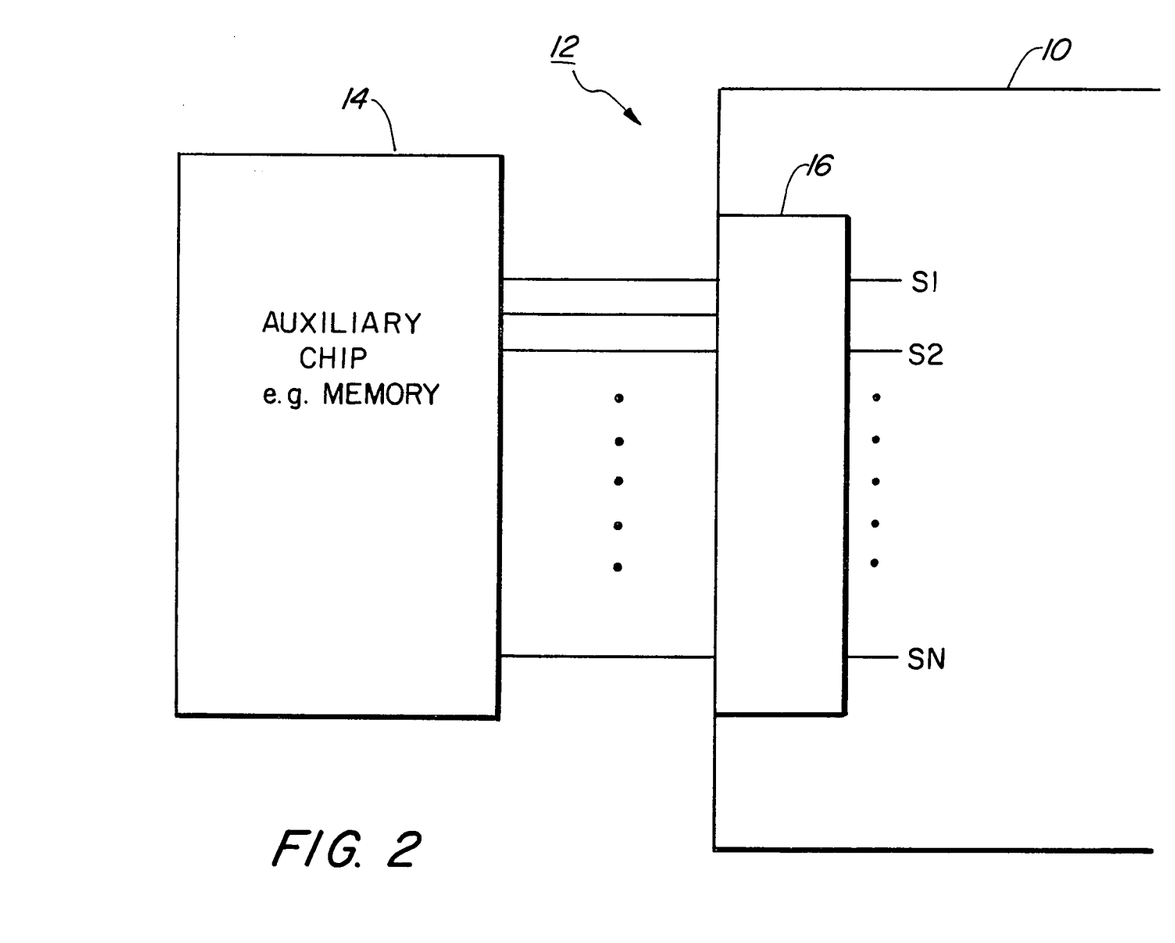
FIG. 2 is a schematic diagram including one or more auxiliary chips that are interfaced to the FPGA and including a portion of the FPGA's gates that implement an interface conversion in order to present a logical interface to the FPGA designer such that the auxiliary chip(s) appear integral to the FPGA.

FIG. 2 is a schematic diagram including one or more auxiliary chips 14 that are interfaced to the FPGA 10 and including a portion 16 of the FPGA's gates that implement an interface conversion in order to present a logical interface to the FPGA designer such that the auxiliary chip(s) 14 appear integral to the FPGA 10.

Figure 3:
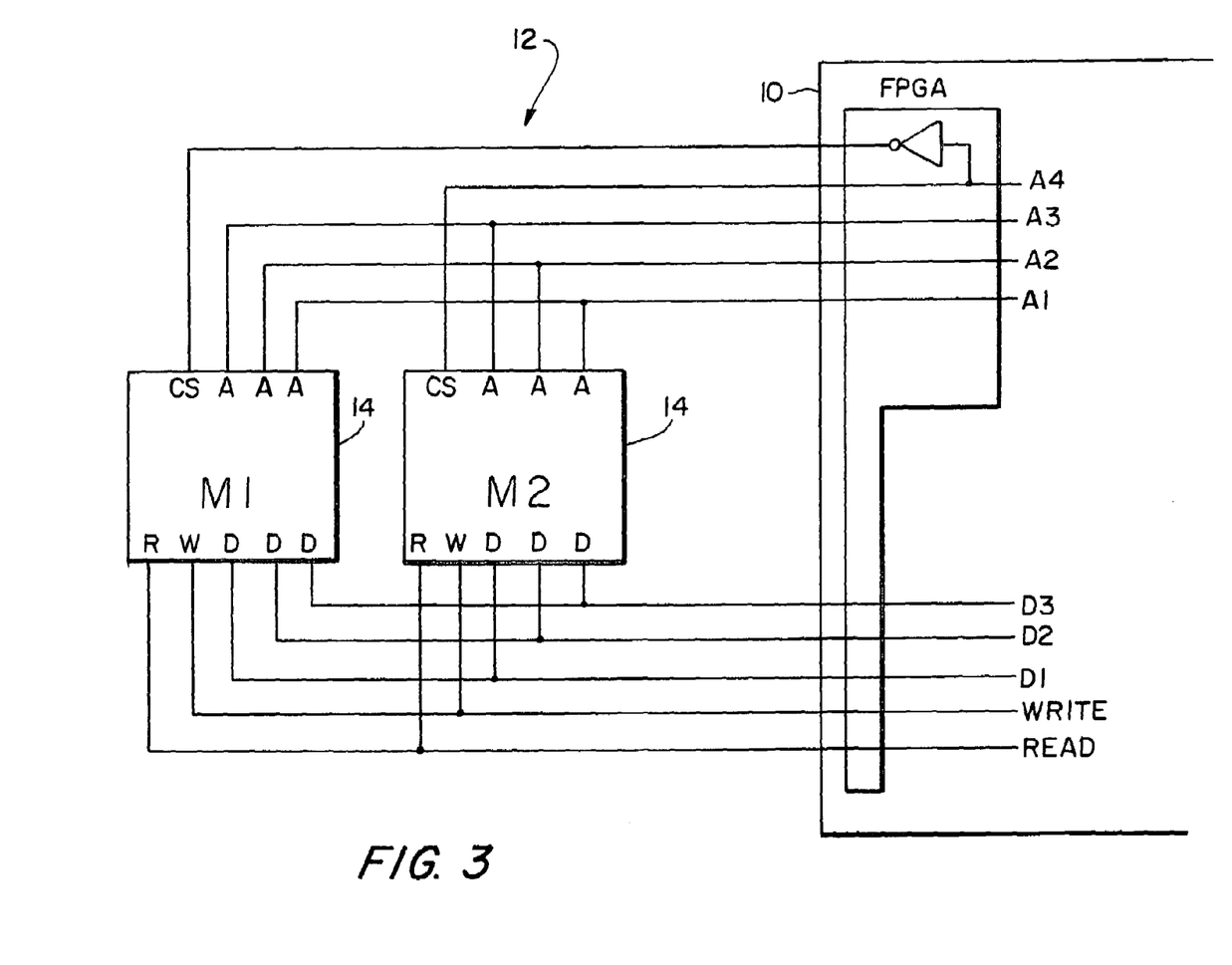
FIG. 3 is a simple example of the FPGA improvement of FIG. 1 where two auxiliary chips comprise memory chips and where the FPGA logic implementing the interface conversion is an inverter that selects one or the other of the memory chips such that the two chips appear as a single larger memory.

FIG. 3 is a simple example of the FPGA improvement of FIG. 1 where two auxiliary chips comprise memory chips and where the FPGA logic 16 implementing the interface conversion is an inverter that selects one or the other of the memory chips such that the two chips appear as a single larger memory.

Figure 4A:
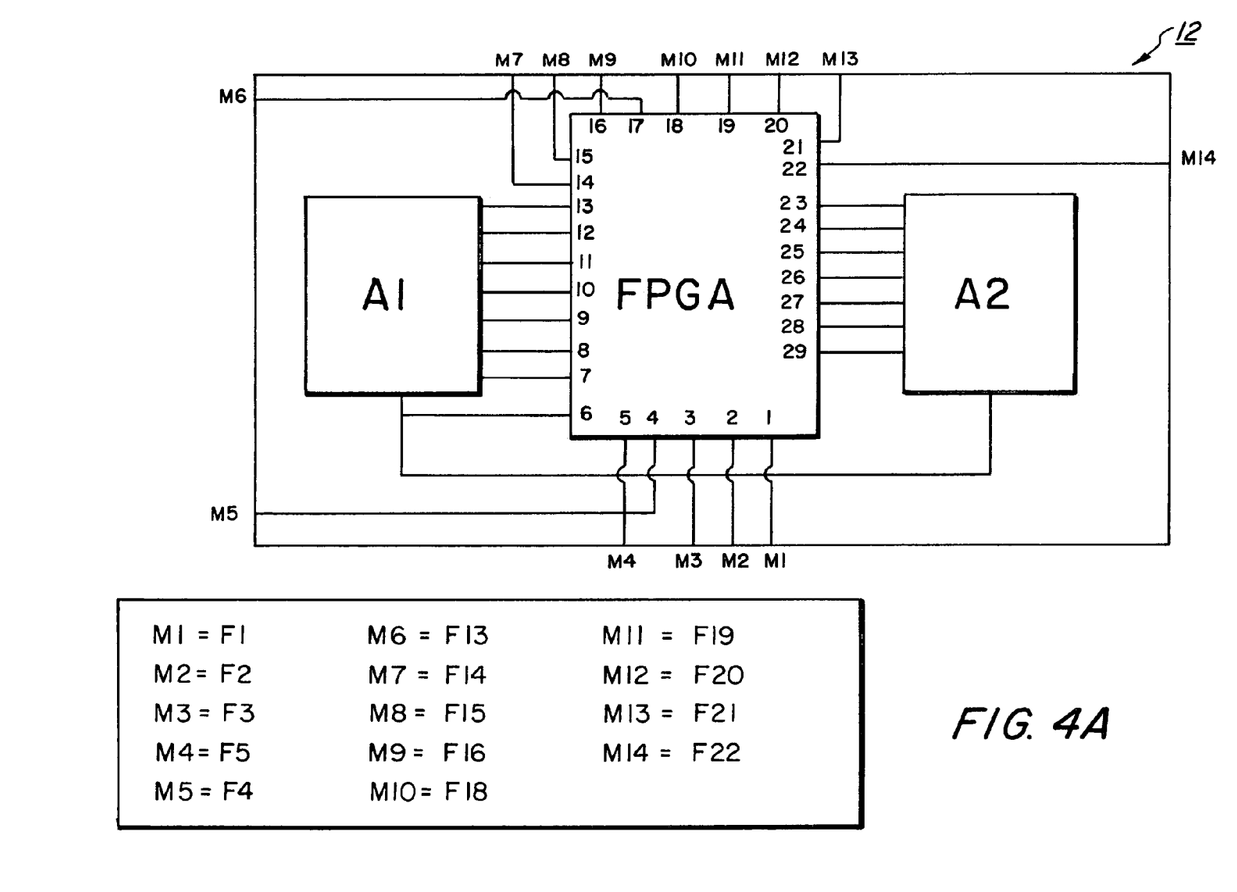
FIG. 4A illustrates an exemplary module from a physical point of view.
Figure 4B:
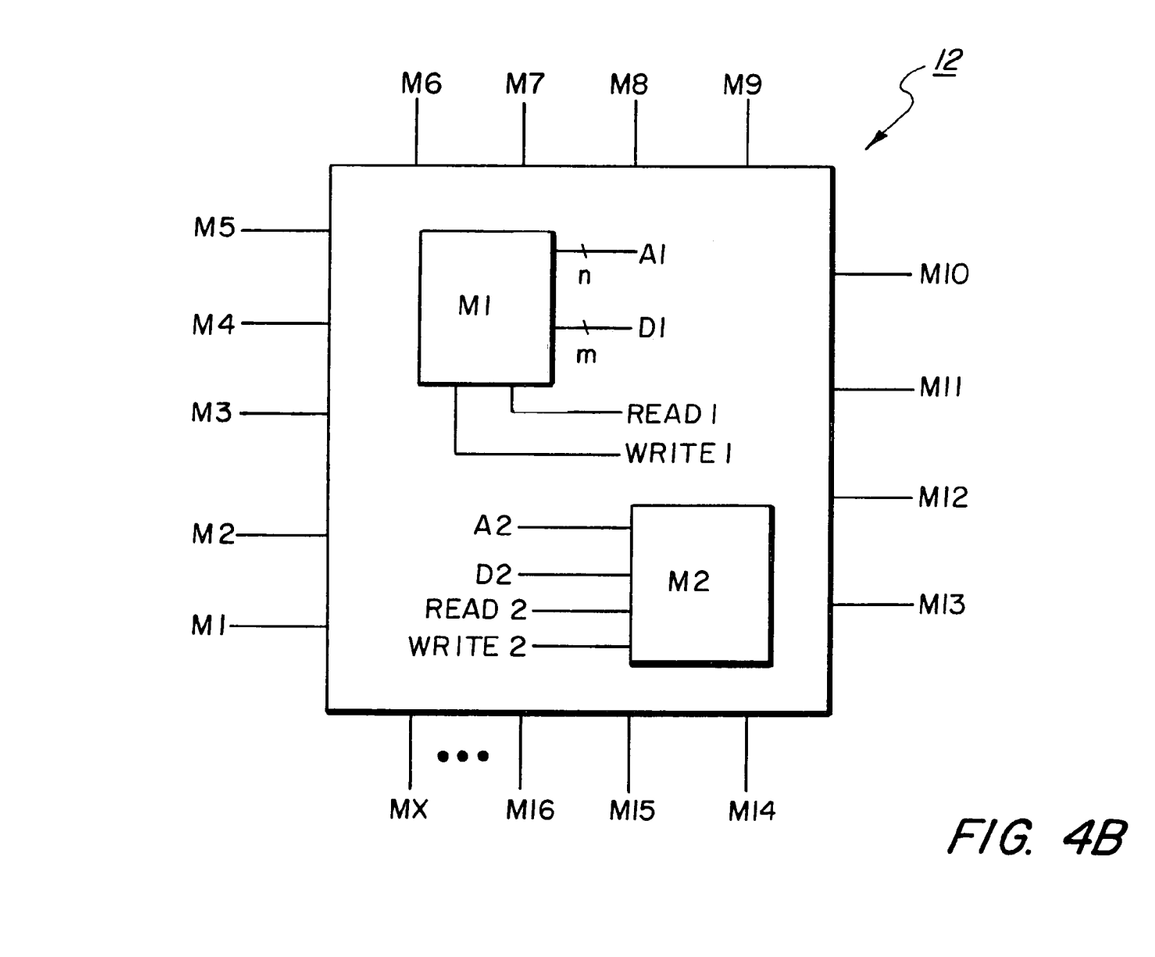
FIG. 4B illustrates the exemplary module of FIG. 3A from a logical point of view, i.e. what the FPGA designer thinks he has.

FIG. 4A illustrates an exemplary module from a physical point of view, whereas FIG. 4B illustrates the exemplary module of FIG. 3A from a logical point of view, i.e. what the FPGA designer thinks he has.

Figure 5:
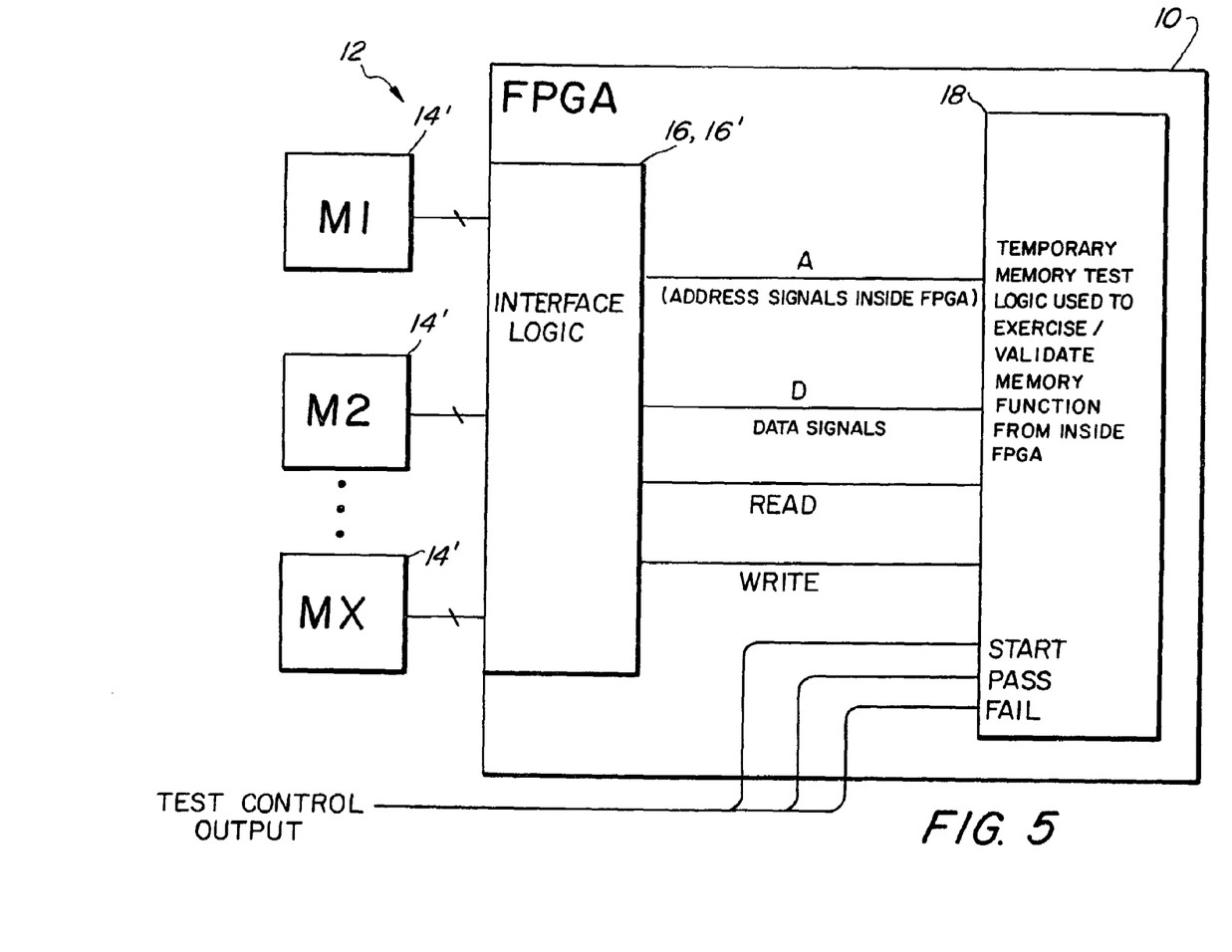
FIG. 5 illustrates an example of an interface test which, in this particular case, is accomplished with memory test logic that validates the memory function from inside the FPGA.

A further aspect of the first preferred embodiment of the invention is a logic design for a test circuit 18 that exercises one or more of the auxiliary logic components 14, which test circuit 18 is temporarily loaded into the FPGA 10 and operated to test the functionality and timing performance of auxiliary logic component(s) 14. It will be appreciated that a particularly advantageous arrangement is one wherein the auxiliary logic components 14 are memory chips 14' and the test logic exercises these memory components 14' by way of the logical interface defined by the interface logic 16. Those familiar with the art will understand that by this means it becomes practical to verify the function and operating speed of the auxiliary component memory elements, as they appear from within the FPGA 10.

It will further be appreciated that this test methodology may be practically applied to all modules of a production run to achieve 100% testing at speed for the memory functionality that is effectively embedded into the FPGA by the combination of the MCM with auxiliary logical component memory elements 14' and the MIPC 16.

Further, it will be appreciated that the functionality and timing of the auxiliary logic components 14 may be so characterized and tested as to allow timing to be represented within the standard FPGA design environment by way of the MIPC 16.

A second embodiment of the invention is one which is generally similar to that described above but in which the additional refinement of a parameterizable definition of the MIPC logic functions is provided. A particularly advantageous example of a parameterizable MIPC 16 is one that defines a memory that may have arbitrary data word width. It will be appreciated that such a memory interface 16' may require multiple memory cycles to read or write a word that is of length different to that of the auxiliary logical memory component(s) 14 attached to the FPGA 10. It will further be appreciated that such a variable word width parameterized MIPC 16' may provide for alignment or nonalignment of memory words with the intrinsic word size of the auxiliary logic memory component(s) 14'; with the advantage of better memory usage in the case of nonalignment; and more regular access time performance in the case of alignment.

In a yet another embodiment of the invention, the interface logic 16' may contain a parameterizable definition of a memory interface that allows multiple FPGA connected memory chips 10 to be accessed either together to generate a wider data word or serially to achieve a greater memory depth.

The foregoing memory embodiments are more fully disclosed in U.S. patent application Ser. No. 10/347,038, filed on Jan. 17, 2003, and entitled "A FIELD PROGRAMMABLE GATE ARRAY WITH A VARIABLY WIDE WORD WIDTH MEMORY", now U.S. Pat. No. 6,856,167, which is incorporated herein by reference.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

I claim:

1. An electronic package having a plurality of pre-formed IC chips encapsulated in stackable layers, the electronic package comprising:
   a field programmable gate array (FPGA) encapsulated in a first stackable layer; and
   at least one auxiliary logic component encapsulated in a second stackable layer, wherein the auxiliary logic component is coupled to the FPGA with at least one intercommunicated clock, control and/or data signal between the FPGA and the auxiliary logic component, and wherein the auxiliary logic component has a functionality which is mapped into the FPGA.

2. The electronic package of claim 1 where the auxiliary logic component and the FPGA are interconnected through discrete interconnections with each other.

3. The electronic package of claim 1 where the auxiliary logic component and the FPGA are interconnected through commonly shared connections.

4. The electronic package of claim 1 further comprising a plurality of auxiliary logic components, and where the plurality of auxiliary logic components and the FPGA are interconnected through commonly shared connections.

5. The electronic package of claim 1 further comprising a plurality of FPGAs, and where the plurality of FPGAs and the auxiliary logic component are interconnected through commonly shared connections.

6. The electronic package of claim 1 further comprising a plurality of FPGAs, and a plurality of auxiliary logic components, and where the plurality of FPGAs and the plurality of auxiliary logic components are interconnected through commonly shared connections.

7. The electronic package of claim 1 where the FPGA has a pin definition and where the mapping of the functionality into the FPGA redefines the FPGA pin definition.

8. The electronic package of claim 7 where the FPGA with redefined FPGA pin definition and the auxiliary logic component function in combination as a modified FPGA.

9. The electronic package of claim 1 wherein a test circuit is programmed into the FPGA to exercise the auxiliary logic component.

10. The electronic package of claim 9 wherein the test circuit exercises the auxiliary logic component to test functionality and timing performance.

11. The electronic package of claim 10 wherein the test circuit tests functionality and timing performance at full speed of operation of the auxiliary logic component.

12. The electronic package of claim 1 where the auxiliary logic component is a memory circuit.

13. The electronic package of claim 12 wherein a test circuit is programmed into the FPGA to exercise the memory circuit.

14. The electronic package of claim 13 further comprising a plurality of memory circuits as auxiliary logic components and wherein the test circuit exercises each of the memory circuits to test functionality and timing performance.

15. The electronic package of claim 1 wherein the functionality of the auxiliary logic component mapped into the FPGA is parameterized.

16. The electronic package of claim 15 wherein the parameterized functionality of the auxiliary logic component mapped into the FPGA comprises an arbitrary data word width.

17. The electronic package of claim 16 wherein the parameterized functionality of the auxiliary component mapped into the FPGA comprises reading and/or writing data words of different lengths into the auxiliary component in both an aligned and a nonaligned manner.

18. The electronic package of claim 15 wherein the parameterized functionality of the auxiliary logic component mapped into the FPGA comprises a memory interface that allows multiple auxiliary logic circuits to be accessed through the FPGA either together to generate a wider data word or serially to achieve a greater memory depth.

19. A method of configuring an electronic package having a plurality of pre-formed IC chips encapsulated in stackable layers, the method comprising:
intercommunicating a field programmable gate array (FPGA) encapsulated in a first stackable layer and at least one auxiliary logic component encapsulated in a second stackable layer, wherein the auxiliary logic component is coupled to the FPGA through at least one common clock, control and/or data signal between the FPGA and the auxiliary logic component; and
mapping a functionality of the auxiliary logic component into the FPGA.

20. The method of claim 19 where intercommunicating the field programmable gate array (FPGA) and the at least one auxiliary logic component comprises interconnecting the auxiliary logic component and the FPGA through discreet interconnections with each other.

21. The method of claim 19 where intercommunicating the field programmable gate array (FPGA) and the at least one auxiliary logic component comprises interconnecting the auxiliary logic component and the FPGA through commonly shared connections.

22. The method of claim 19, wherein the electronic package includes a plurality of auxiliary logic components, and where the intercommunicating step comprises interconnecting the plurality of auxiliary logic components and the FPGA through commonly shared connections.

23. The method of claim 19, wherein the electronic package includes a plurality of FPGAs, and where the intercommunicating step comprises interconnecting the plurality of FPGAs and the at least one auxiliary logic component through commonly shared connections.

24. The method of claim 19, wherein the electronic package includes a plurality of FPGAs and a plurality of auxiliary logic components, and where the intercommunicating step comprises interconnecting the plurality of FPGAs and the plurality of auxiliary logic components through commonly shared connections.

25. The method of claim 19 where mapping of the functionality into the FPGA comprises redefining a pin definition of the FPGA.

26. The method of claim 25 further comprising operating the FPGA with redefined FPGA pin definition and theauxiliary logic component in combination as a modified FPGA.

27. The method of claim 19 further comprising programming a test circuit into the FPGA and exercising the auxiliary logic component with the test circuit programmed into the FPGA.

28. The method of claim 27 wherein exercising the auxiliary logic component with the test circuit programmed into the FPGA comprises exercising a memory circuit.

29. The method of claim 28 further comprising exercising a plurality of memory circuits as auxiliary logic components to test functionality and timing performance.

30. The method of claim 27 wherein exercising the auxiliary logic component with the test circuit programmed into the FPGA tests functionality and timing performance of the auxiliary logic component.

31. The method of claim 30 wherein the test circuit tests functionality and timing performance at full speed of operation of the auxiliary logic component.

32. The method of claim 19 wherein mapping the functionality of the auxiliary logic component into the FPGA comprises mapping a parameterized functionality of the auxiliary logic component mapped into the FPGA.

33. The method of claim 32 wherein mapping a parameterized functionality of the auxiliary logic component mapped into the FPGA comprises mapping reading and/or writing an arbitrary data word width into or out of the auxiliary logic component by means of the FPGA.

34. The method of claim 33 wherein mapping reading and/or writing an arbitrary data word width into or out of the auxiliary logic component by means of the FPGA comprises reading and/or writing data words of different lengths into the auxiliary logic component in both an aligned and a nonaligned manner.

35. The method of claim 32 wherein mapping a parameterized functionality of the auxiliary logic component mapped into the FPGA comprises accessing multiple auxiliary logic circuits through a memory interface coupled to the FPGA either to generate a wider data word or serially to achieve a greater memory depth.

* * * * *